July 2, 1957 B. H. ALEXANDER 2,798,189

STABILIZED SEMICONDUCTOR DEVICES

Filed April 16, 1953

INVENTOR
BEN H. ALEXANDER
BY Paul S. Martin
ATTORNEY

United States Patent Office 2,798,189

Patented July 2, 1957

2,798,189

STABILIZED SEMICONDUCTOR DEVICES

Ben H. Alexander, Waltham, Mass., assignor to Sylvania Electric Products Inc., a corporation of Massachusetts Application April 16, 1953, Serial No. 349,280

3 Claims. (Cl. 317—235)

The present invention relates to semiconductor devices such as rectifiers of the point-contact and junction types and to transistors of both point-contact and junction types. It also relates to methods of fabricating such devices.

Semiconductor devices which depend upon the formation of a P–N junction in a semiconductor body between two semiconductor portions of opposite conductivity types inevitably involve a meeting between the P–N junction and the outside surface of the semiconductor body. At this meeting, all kinds of deleterious effects occur occasionally which cause erratic performance, drift, and uncertain length of life. In order to avoid such instability, it has previously been proposed to protect the outside surface by coating it with organic materials of various kinds, but these attempts have met with only limited success. Objects of the present invention are to provide a semiconductor device of improved stability and a method of making such improved semiconductor device. In the illustrative application of the invention, a highly insulating material is applied, preferably as a film, over the surface of the semiconductor device which previously had been formed to have a rectifying connection, either the so-called point contact type or the junction type. The film of material should be highly insulating, and should be physically continuous so as to exclude foreign materials and in particular to exclude moisture which might promote occurrence of electrolytic action and chemical reaction. Boron is an exemplary material for this purpose. To the extent that the skin is porous, its value may be reduced, but even an imperfect skin is of value in reducing the foregoing difficulties.

Certain forms of amplifying semiconductor devices depend upon multiple rectifying barriers close to each other; and there is evidence to show that their electrical characteristics are significantly influenced by surface effects, particularly at the portion of the surface between the rectifying barriers. Consequently, it is of importance to protect the surface of semiconductor devices not merely at the places where the rectifying barriers meet the outside surface of the semiconductor, but also to protect the whole surface area and particularly the surface portions between multiple close rectifying barriers.

The nature of the invention and its various further features of novelty will be apparent from the following detailed disclosure of two illustrative embodiments shown in the accompanying drawings, wherein.

Figure 1:
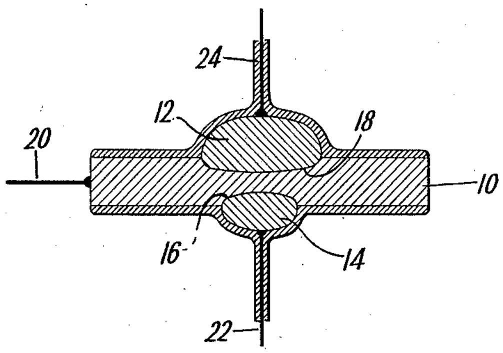
Fig. 1 is a greatly enlarged somewhat schematic representation in cross section of a junction-type transistor embodying an application of the invention.

In Fig. 1 there is illustrated a junction type transistor in which a body 10 of semiconductor such as N-type germanium of suitably high resistivity is provided with rectifying terminals 12, 14 as by alloying terminals of indium to the germanium, to produce a pair of rectifying junctions 16 and 18 as indicated. These junctions are desirably quite close to each other as is well known. Suitable terminal wires 20, 22 and 24, all conducting, are joined to the body 10 and to the alloy terminals 12 and 14.

Such a device tends to be unstable, for reasons that have been attributed to local electrolytic chemical action at the regions where the P–N junctions 16 and 18 emerge at the surface of the device. This is cured in accordance with the present invention by forming on the surface of the device a thin insulating inorganic skin, which need not be thin but ideally should be vapor proof. Such skin can be effectively deposited by exposing the unit thus far described to vapor-deposited boron as in an evacuated bell jar containing an electrically heated filament as of tungsten bearing a supply of boron which is to be evaporated. While boron is a metal, in usual chemical classification, it is of remarkably high resistivity and even though it may introduce some of its own leakage in spanning the rectifying junctions, it nevertheless operates to stabilize the resulting device.

Figure 2:
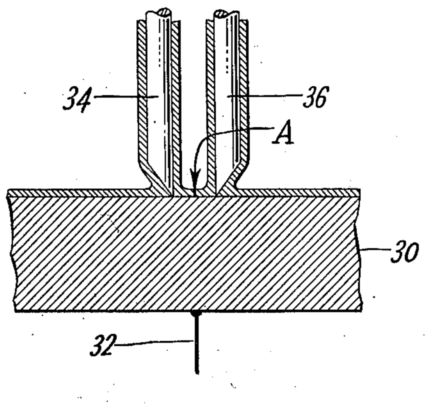
Fig. 2 is a similar greatly enlarged somewhat schematic view in cross-section of a point-contact transistor, both Figs. 1 and 2 embodying aspects of the invention.

In Fig. 2 there is illustrated a semiconductor device including a body 30 either of silicon or of germanium having an ohmic connection 32 and rectifying sharp-ended wires 34 and 36 which engage a suitably prepared surface of the body 30 close to each other, separated by a few thousandths of an inch or less, as is well known.

As in Fig. 1, each rectifying connection is protected by a film, vacuum-deposited, of an insulating inorganic material notably boron, in the region of the rectifying contacts. This is effective to stabilize the unit, even though it may somewhat reduce the rectification efficiency of the device. Additionally the electrical characteristics of the device are enchanced by protecting the surface A between the rectifying contacts, and other surface portions of the semiconductor where electrical interaction between the signal and operating potentials takes place.

It will be at once apparent that the invention applies to transistors having additional closely adjacent "point-contacts" each of the type in Fig. 2 as well as to the so-called point-contact and junction rectifiers having only one rectifying terminal connection. Because varied application and modification of the invention will be readily apparent to those skilled in the art, the appended claims should be accorded a broad latitude consistent with the spirit and scope of the invention.

What is claimed is:

1. A semiconductor device including a body of semiconductor material, a rectifying connection to said body, and a film of boron coating over the surface of said device where the rectifying junction meets the surface.

2. A semiconductor device including a body of semiconductor material, plural rectifying connections to said body close to each other, and a coating of boron over the surface of said body at the junction of the rectifying connections with the body.

3. A semiconductor device including a body of semiconductor material, and ohmic low resistance connections to said body, and a pair of sharp rectifying contacts engaging said body at points sufficiently close to each other to effect transistor action, and a coating of boron over the surface of said body at the junction of the rectifying connections with the body.

References Cited in the file of this patent

UNITED STATES PATENTS

| | | |
|---|---|---|
| 2,475,940 | Brittain | July 12, 1949 |
| 2,547,386 | Gray | Apr. 3, 1951 |
| 2,560,792 | Gibney | July 17, 1951 |
| 2,586,609 | Burke | Feb. 19, 1952 |
| 2,606,960 | Little | Aug. 12, 1952 |
| 2,629,767 | Nelson et al. | Feb. 24, 1953 |
| 2,666,874 | Barton | Jan. 19, 1954 |
| 2,684,457 | Lingel | July 20, 1954 |